United States Patent [19]
Pham et al.

[11] Patent Number: 5,300,831
[45] Date of Patent: Apr. 5, 1994

[54] LOGIC MACRO AND PROTOCOL FOR REDUCED POWER CONSUMPTION DURING IDLE STATE

[76] Inventors: Dac C. Pham, 9815 Copper Creek Dr., #922, Austin, Tex. 78729; Sebastian T. Ventrone, 1 Appletree La., Jericho, Vt. 05465; Jonathan H. Raymond, R.R. #2, Box 623, Underhill, Vt. 05489

[21] Appl. No.: 940,249

[22] Filed: Sep. 4, 1992

[51] Int. Cl.⁵ .................. H03K 19/173; H03K 3/01
[52] U.S. Cl. .................................. 307/465; 307/296.3
[58] Field of Search .................. 307/465, 296.3, 480

[56] References Cited

U.S. PATENT DOCUMENTS

| | | | |
|---|---|---|---|
| 4,233,667 | 11/1980 | Devine et al. | 307/465 |
| 4,686,386 | 8/1987 | Tadao | 307/269 |
| 4,697,105 | 9/1987 | Moy | 307/465 |
| 4,760,290 | 7/1988 | Martinez | 307/465 |
| 4,906,862 | 3/1990 | Itano et al. | 307/465 |
| 4,906,870 | 3/1990 | Gongwer | 307/465 |
| 5,008,569 | 4/1991 | Roy | 307/465 |
| 5,187,392 | 2/1993 | Allen | 307/465 |

FOREIGN PATENT DOCUMENTS 305980  8/1989  European Pat. Off. .

OTHER PUBLICATIONS

"Minimizing Power in High Performance", IBM Tecnical Disclosure Bulletin, vol. 32, No. 6B, pp. 362-367, 1989.

Cases et al. "CMOS Programmable Logic Array", IBM Technical Disclosure Bulletin, vol. 26, No. 11, pp. 5835-5837, 1984.

*Primary Examiner*—Edward P. Westin
*Assistant Examiner*—Richard Roseen
*Attorney, Agent, or Firm*—Heslin & Rothenberg

[57] ABSTRACT

A control circuit and protocol are disclosed for an integrated circuit (such as a static PLA) wherein standby power is minimized during an idle processor state condition without loss of circuit outputs. For static PLAs, control circuits shutoff any active current path and drive the logic array outputs to zero whenever an idle state condition exists. Inputs to the logic array are held in static latches associated with the static PLA. The novel halt protocol includes: powering-down the logic macro upon initiation of an idle state by halting all internal clocks and then decoupling the logic array from power supply voltage VDD. Circuit power-up includes reactivating the logic array by first coupling the array to supply voltage VDD and allowing sufficient time for the outputs of the array and any associated logic to stabilize; and then restarting the previously halted internal clocks. Analogous techniques are also described for dynamic PLAs.

23 Claims, 7 Drawing Sheets

LOGIC MACRO AND PROTOCOL FOR REDUCED POWER CONSUMPTION DURING IDLE STATE

TECHNICAL FIELD

The present invention relates in general to high performance integrated circuits having an idle state protocol, and in particular, to a control circuit and protocol for a logic macro (such as a static or dynamic programmable logic array (PLA)) implemented in complementary (e.g., CMOS) technology wherein standby power is minimized during the idle state condition without loss of integrated circuit states and without requiring that the output states of the logic macro be stored prior to the idle state condition.

BACKGROUND ART

A programmable logic array (PLA) implements a desired logic or truth table by accepting a plurality of logical input signals and decoding them to provide a plurality of output signals. Typically, input signals are maintained in storage, for example, in a static latch, coupled to the input of the PLA until the particular combinatorial and/or sequential function implemented by the array is completed. The input signal decoding function is usually accomplished using two arrays of logic gates, typically referred to as the 'AND' plane and the 'OR' plane. The input signals are applied to the AND plane, which partially decodes them and applies the intermediate results as inputs to the OR plane. The terms AND and OR are representative of the Boolean algebra operations that are conventionally performed in the respective arrays. However, electrically both arrays are very similar, and comprise a series of signal line conductors whose voltage state represents the logical value of a given logic output term (OR plane), or intermediate result (AND plane).

The signal line conductors in both the AND and OR planes are precharged to a high voltage state in the case of a dynamic PLA. In the case of a static PLA, they are connected to a load device that tends to continuously pull them up to a high voltage state. In either case, logic transistors are connected in a desired parallel pattern between the signal lines and a reference voltage (e.g., ground). In order to perform a decoding operation, the input signals (or intermediate results) are applied to the control terminals of the logic transistors. If any of the logic transistors connected to a given signal line is thereby placed in the conductive state, the signal line is pulled down to the ground voltage state. Hence, electrically both the AND and OR planes perform a "NOR" operation.

The dynamic PLA design provides for low current consumption, since no dc current flows through the conductive logic transistors during a decode operation. However, clocks are required to switch between the precharge and decode operations for the AND and OR planes in a dynamic PLA. A first clock is applied to the AND plane, and a second clock (delayed relative to the first) is applied to the OR plane, so that the AND plane has sufficient time to complete its decode operation prior to performing the decode in the OR plane. The delay between the clocks must be sufficiently long to ensure that no erroneous discharge of a conductor occurs in the OR plane, since once discharged there is no further precharge signal available, and an erroneous output results. A disadvantage of using two clocks is that the circuit required for the clock signals does not readily fit in the area of either the AND or the OR plane, so that it must be placed externally thereto. This increases the area and complicates the layout of the integrated circuit, especially when computer aided design techniques utilizing geometrically regular blocks of circuitry are employed.

The present trend therefore is for the use of static arrays for both the AND and the OR planes. A static array beneficially eliminates the need for any clocks, since both planes are receptive to decoding input signals whenever they arrive. This approach also provides the smallest layout area. Unfortunately, in addition to drawing dc current whenever any of the logic transistors is in an "on" (i.e., conducting) state, a static PLA also consumes a measurable amount of power in the standby mode or idle state condition. Conventional static PLAs are known to consume considerably more dc power than a CMOS or dynamic PLA configuration.

In the portable computer industry the current practice is to enter a standby mode whenever the processor is idle or halted. Again, during standby mode the goal of the processing system is to consume minimal dc power, and thereby effect a minimal drain on the battery. The system is unable to power down completely, however, because the current state of the processor must be maintained when the user resumes operation. The standard power conserving technique employed for static PLAs is to terminate the internal clock to the various components of the static design simultaneous with initiation of the idle state condition. However, dc power (e.g., on the order of milliamps) continues to be consumed even with the internal clock stopped. This is due to the pull-up portion of the static PLA circuit. Given a sufficient period of time such a continuing dc power drain becomes significant for a battery based system.

Therefore, a need exists in the art for a logic macro and protocol which minimize (if not effectively eliminate) standby dc power drain through a logic array while in an idle state without subsequent loss of output state and without requiring that the outputs of said logic macro be stored prior to initiation of the idle state condition.

DISCLOSURE OF THE INVENTION

Briefly summarized, in one aspect a method for reducing power drain within a logic macro during an idle state is presented. The logic macro includes a static logic array having a plurality of data inputs which are coupled to a static latch which holds current data input to the array. The logic array is coupled to a supply voltage VDD and has an output based on the input data thereto. The logic macro is clocked with an internal clock. The processing method includes the steps of: deactivating the logic macro in response to initiation of an idle state by halting the internal clock to the macro and subsequent thereto at least partially decoupling the static logic array from the supply voltage VDD so that standby power drain through the array is reduced; subsequently reactivating the logic array in response to detection of idle state termination by recoupling the logic array to the supply voltage VDD to the extent previously decoupled and allowing sufficient time for the output of the array to stabilize based on the current data input held in the associated status latch; and restarting the internal clock to the logic macro subsequent stabilization of the output of the logic array whereby power is minimized without loss of state information or requiring the separate storing of state information prior to idle mode initiation. Power-down and power-up processes for minimizing power consumption within a integrated circuit such as a static logic array are also presented. In addition, enhanced features of all of these processing techniques are described.

In another aspect, a power conserving method for an integrated circuit including a static logic portion and a dynamic logic portion is described. The dynamic logic portion is coupled to receive its input from the output of the static logic portion and each logic portion receives an internal clock signal. The power conserving method includes the steps of: halting the internal clock to the dynamic logic portion upon detection of an idle state condition; subsequent halting of the dynamic portion clock, halting the internal clock to the static logic portion of the integrated circuit; maintaining the internal clocks in their halted condition for the duration of the idle state; returning the dynamic logic portion to an active state after termination of the idle state condition by restarting the dynamic logic portion's internal clock; waiting sufficient time for the output of the dynamic logic portion to stabilize; and then restarting the internal clock to the static logic portion of the integrated circuit.

In yet another aspect, a programmable logic array which consumes substantially zero dc power when in standby mode is presented. This logic array includes a plurality of input ports for receiving a plurality of differential input signals and a plurality of output ports for providing a plurality of output signals based thereon. The array further includes a plurality of product term nodes, and a plurality of first pull-down devices each of which is connected between ground and a selected on of the product term nodes and has its control port connected to a selected one of the true or complement of a selected input signal. A plurality of second pull-down devices is connected between ground and one of a plurality of pull-up devices and has its control port connected to a selected one of the product term nodes. The point of connection of these devices to their current source is also connected to one of the output ports. A plurality of control circuits is provided each comprising a first transistor device connected to the power supply and a second transistor device, complementary to the first device, connected to ground. Each of the first and second transistor devices is connected in series through a common point that is also connected to one of the product term nodes. The gates of the control circuits are connected to a control port and the provision of a "1" to the control port activates the second device so as to drive the product terms to "0", while the provision of a "0" to the control port activating the first device provides a pull-up function to the first plurality of pull-down devices. An integrated circuit having such a logic array in combination with a static latch is also described.

Again, to summarize, novel control circuits and protocol for a logic macro wherein standby power drain in minimized during an idle state condition are provided herein. Power conservation is accomplished without the loss of integrated circuit states and without requiring the outputs of the logic macro to be stored prior to initiation of the idle state. The techniques presented beneficially allow for a more practical use of high performance and high density static PLAs in a portable computer. In a static PLA embodiment, the circuit and protocol allow for the consumption of several orders of magnitude less power when the processor is in standby mode in comparison with conventional circuit shutdown approaches. Extended battery life is an obvious result of reducing standby power consumption and is a significant advantage.

BRIEF DESCRIPTION OF THE DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

The techniques described herein can be employed in connection with a number of different types of integrated circuits. For example, the low power consumption concepts can be used in connection with a static logic array (such as a static PLA), a dynamic logic array (e.g., a dynamic PLA), and certain types of CMOS circuits (such as a clock shaping network), all of which are often characterized by an unacceptable level of power consumption when the processor is in standby mode. The present invention is described below primarily with reference to static PLAs; however, those skilled in the art will recognize the general applicability of the presented concepts to dynamic PLAs and to other types of CMOS integrated circuits. The claims appended hereto are intended to encompass all such uses.

Figure 1:
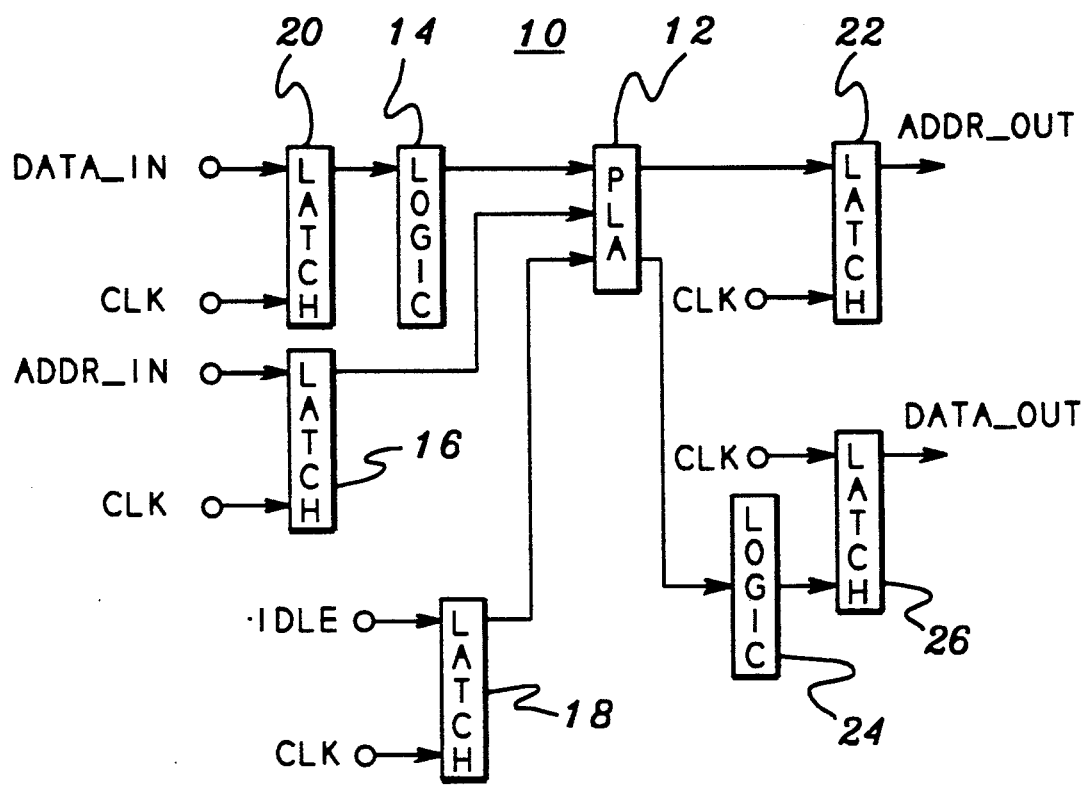
FIG. 1 is a block diagram representation of one embodiment of a logic macro pursuant to the present invention.

Reference is initially made to FIG. 1 wherein one embodiment of a logic macro, generally denoted 10, is depicted. Macro 10 includes a programmable logic array (PLA) 12 which receives logic input from a logic block 14, address input via a latch 16, and an idle state control signal through a latch 18. Input data (DATA IN) to logic 14 is held at a latch 20, which is clocked via an internal clock signal "CLK". Similarly, address data (ADDR_IN) in latch 16 is clocked by an internal clock signal "CLK", as is the idle state condition (active/inactive) held at latch 18. PLA 12 is assumed to comprise a static PLA. Output from PLA 12 is an address (ADDR_OUT), which is sent to a latch 22, and logic data (DATA_OUT), which (in this example) is sent to a logic circuit 24. Output from logic 24 is also latched 26. Data from latch 22 (ADDR_OUT) and latch 26 (DATA_OUT) is clocked out by an internal clock signal "CLK".

In general, control protocol for PLA 12 can be divided into three modes, namely, a normal mode, an idle mode and a test mode. In the normal mode, a standard internal clock signal "CLK" is provided to each of the latches 16, 18, 20, 22, 26 and the idle state control signal (IDLE) is held "inactive" at latch 18. The output of PLA 12 is then a function of its logic (DATA_IN) and address (ADDR_IN) inputs. In the idle mode, the internal clock signals "CLK" are halted and the idle state control signal (IDLE) is "active" at latch 18. Given these inputs, the outputs of PLA 12 are forced low. A test mode exists when an "inactive" IDLE signal is applied to PLA 12 and scan patterns are input thereto such that the output should be a function of the scan patterns.

Figure 2:
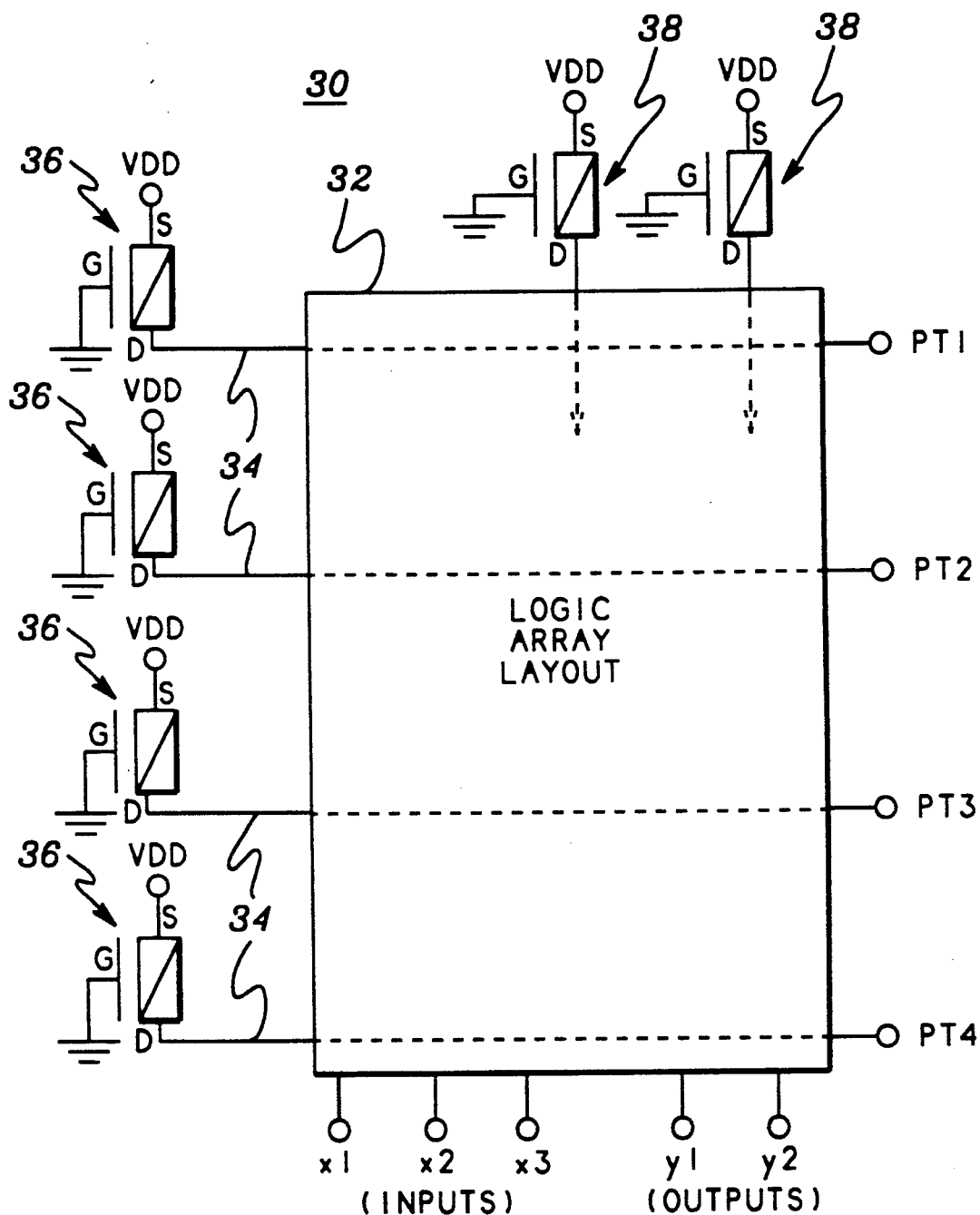
FIG. 2 is a generalized schematic of one embodiment of a conventional static programmable logic array (PLA)

One generalized embodiment of a static logic array, denoted 30, is depicted in FIG. 2, wherein complementary metal oxide semiconductor (CMOS) circuits with P-channel field-effect transistors (PFETs) are indicated by a rectangle with a diagonal line formed therein and a control element or gate electrode arranged adjacent thereto and (in FIG. 3) N-channel field-effect transistors (NFETs) are depicted as a rectangle without a diagonal line and with a control element or gate electrode arranged adjacent thereto.

Static PLA 30 includes a combinatorial and/or sequential logic layout 32 wherein a plurality of line nodes 34 are driven by field effect transistors 36 connected to a circuit supply voltage VDD so as to comprise pull-up devices. PLA 30 includes a plurality of logic input lines (e.g., x1, x2, x3) and multiple logic output lines (e.g., y1, y2). Power to gate output lines y1, y2 is supplied by field-effect transistors 38, which are also connected at their source to supply voltage VDD. An address signal is output from layout 32 on lines PT1, PT2, PT3, PT4.

More specifically with respect to drivers 36, the source "S" of each pull-up device 36 is connected to circuit voltage VDD, the drain "D" is connected to a respective one of the line nodes 34 in logic layout 32, and the gate "G" is tied to ground. As noted initially, this dedicated, pull-up portion of the PLA circuit continues to consume dc power notwithstanding placement of the logic macro in an idle state, i.e., by the conventional approach of stopping all internal clocks. This is because an active pathway will continue to exist between supply voltage VDD and ground potential "GND" across each of the pull-up devices.

Figure 3:
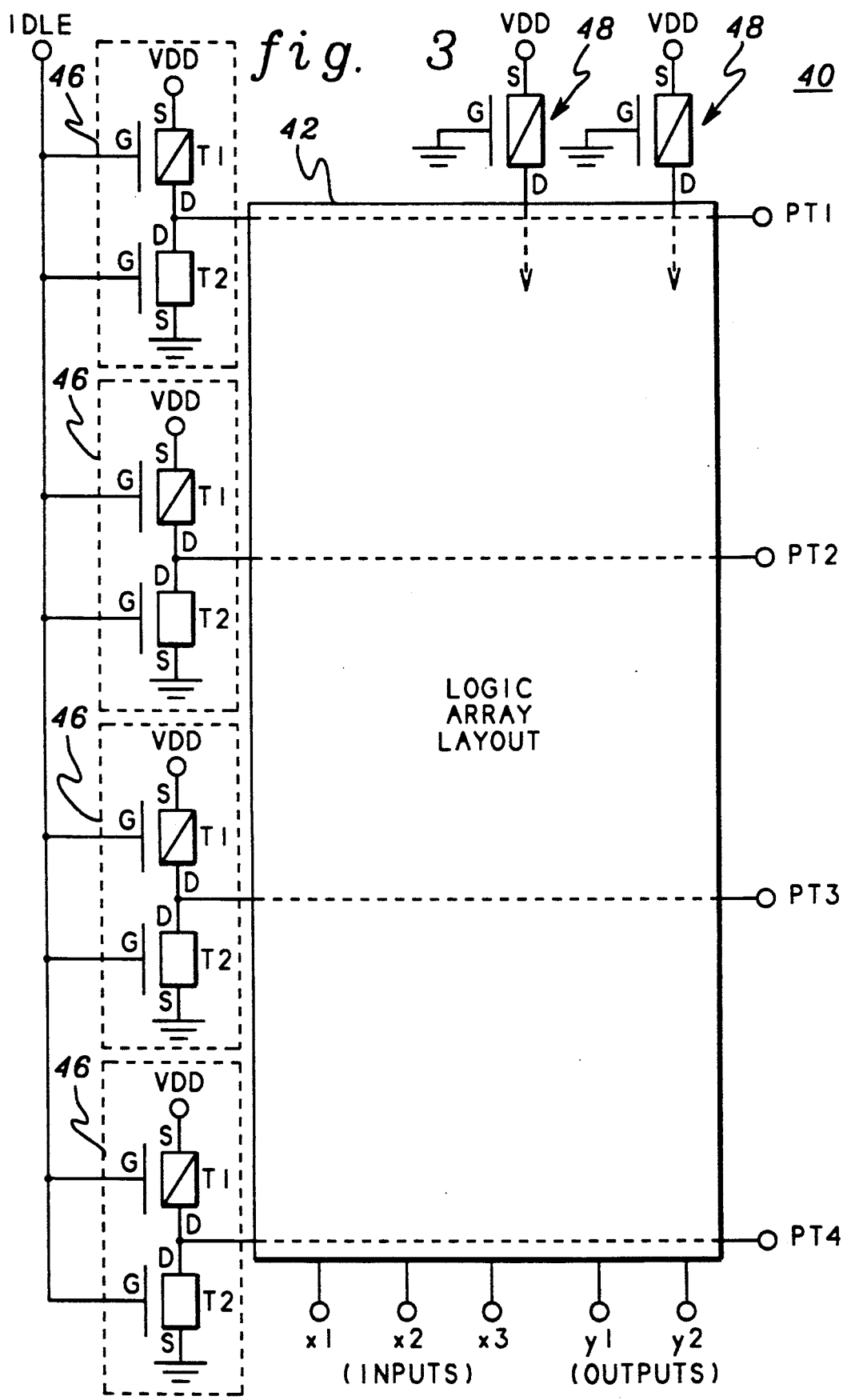
FIG. 3 is a generalized schematic of one embodiment of a static programmable logic array (PLA) pursuant to the present invention.

A modified static logic array, denoted 40, pursuant to the present invention is depicted in FIG. 3. This structure includes an array layout 42, which is assumed to be the same as layout 32 of the static PLA embodiment depicted in FIG. 2. Layout 42 includes logic inputs x1, x2 and x3 and logic outputs y1 and y2, along with address outputs PT1, PT2, PT3 and PT4. In addition, drivers 48 having source, drain and gate connections the same as drivers 38 to layout 32 of FIG. 2 are provided. In logic array 40 (FIG. 3), however, the pull-up drivers 36 for nodes 34 in layout 32 (FIG. 2) are replaced by control circuits 46 (outlined in phantom), each of which receives as input the IDLE control signal (i.e., active or inactive) maintained, for example, in latch 18 of macro 10 (FIG. 1).

Each control circuit 46 includes a PFET T1 having a source "S" connected to supply voltage VDD and a drain "D" connected to one of the line nodes in array layout 42. The drain "D" of an NFET T2 is also connected to the drain "D" of PFET T1, while the source "S" of NFET T2 is grounded. NFET T2 and PFET T1 are each gated "G" by the IDLE control signal. Thus, when the IDLE signal is low (or inactaive), meaning that array 40 is to be active, PFET T1 is "on" while NFET T2 is "off". In such a configuration, control circuit 46 functions as a pull-up device to the associated line node in layout 42. However, when the IDLE signal is high (or active), the control circuit controls the pull-up network by setting all product terms to "0" (ground), i.e., with transistor T2 enabled all outputs are set to "0". Thus, no active path exists between power and ground and no power is dissipated across the pull-up devices. This allows the load device PFET T1 to be turned off for a zero current test during manufacturing or, more importantly, when the CPU is inactive, to yield improved low power requirements.

In addition to providing certain novel control circuits, such as circuits 46 depicted in logic array 40 of FIG. 3, a unique control sequence is presented herein to ensure correct machine operation. A processor is assumed to enter low power mode whenever a halt instruction is executed. Further, it is assumed that upon execution of a halt instruction all internal clocks can be stopped, and only resumed when an external event signal triggers the end of the halt condition. To ensure correct operation subsequent a halt condition (i.e., without requiring a global reset) the internal state of the machine must remain in tact. However, logic arrays such as described with reference to FIG. 3 will drive zeros on their outputs when halted, thereby changing the state of the processor when in a low power mode. Two solutions are possible. One is to maintain the logic arrays in the active state notwithstanding a halt condition, thereby consuming excessive power, or a second is to provide a control sequence which ensures that the PLAs will be returned to an active state before internal clocks are restarted. This later approach is adopted by processing approaches pursuant to the present invention.

An overview of one such control sequence is set forth in FIG. 4 and explained below with reference to the timing diagram and circuitry of FIGS. 5 and 6, respectively. This embodiment is provided for purposes of explanation only and again it should be understood that the invention is not limited to the particular process steps and/or structure described.

Figure 5:
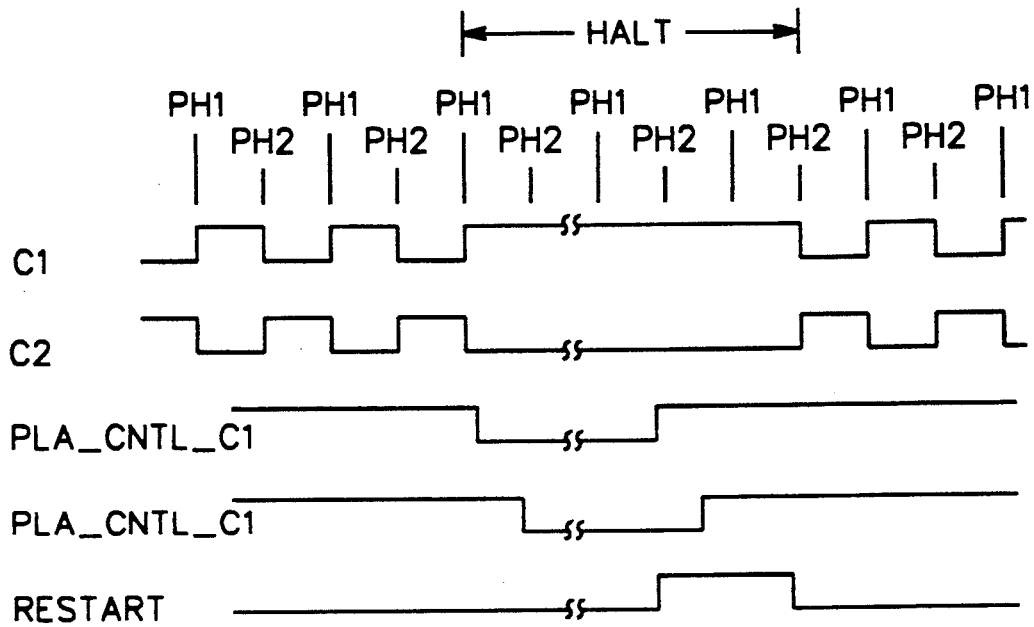
FIG. 5 is a timing diagram useful in explaining power-up processing pursuant to the present invention for a logic macro such as shown in FIG. 6.
Figure 6:
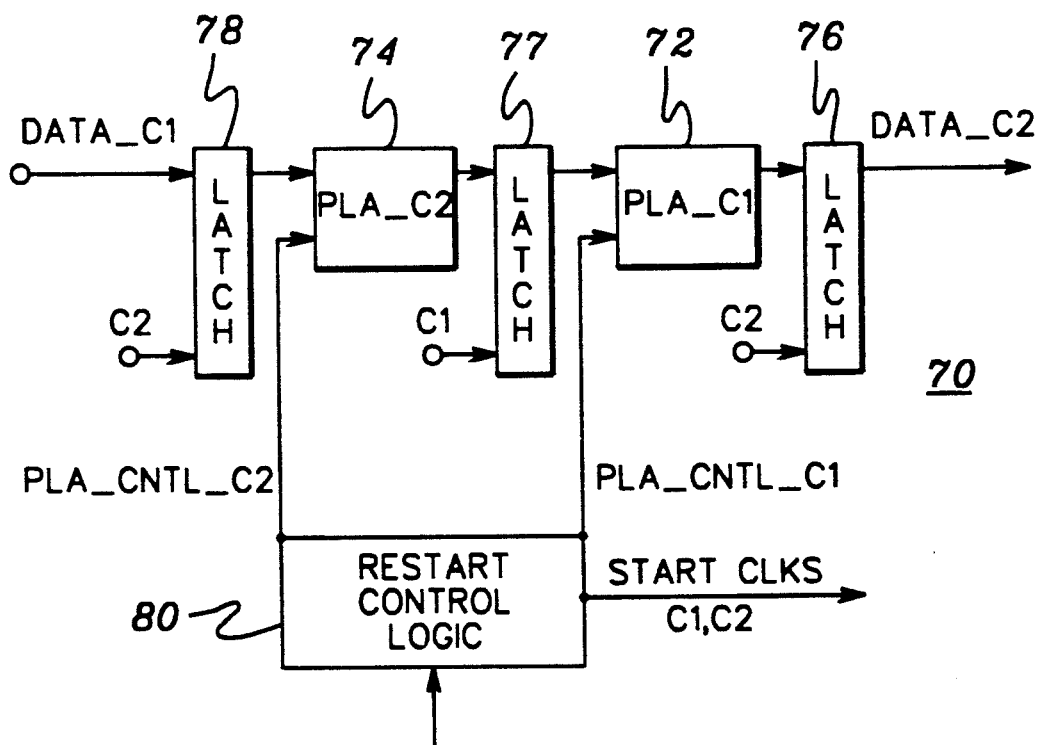
FIG. 6 is a block diagram representation of one embodiment of a two-stage static logic array macro and associated control logic pursuant to the present invention.

Referring first to FIGS. 5 and 6, it is assumed that two internal clocks 'C1' and 'C2' drive a logic macro 70 (FIG. 6) with clock signal 'C1' being of a first phase 'PH1' and clock signal 'C2' being of a second phase 'PH2' (see FIG. 5). In macro 70, a first logic array PLA_C1 72 outputs data (DATA_C2) to a latch 76. Array 72 is controlled by a signal PLA_CNTL_C1 received from a restart control logic 80 and its current input is held in a static input latch 77. Latch 77 is clocked by signal C1 while latch 76 receives clock signal C2. Latch 77 is fed by the output from a second logic array PLA_C2 74, which is also connected to restart control logic 80 to receive a control signal (i.e., signal PLA_CNTL_C2). The input to array 74, temporarily held in a static latch 78, comprises a signal DATA_C1. Latch 78 is clocked by signal C2.

Obviously the alternating of internal clocks to drive the logic arrays and associated latches is optional, as is the number of clock signals utilized. For example, 1, 2, 3 . . . N clock signals of offset phases could be employed. Logic 80 receives an external trigger signal or "restart signal" to initiate switching of the IDLE control signals PLA_CNTL_C1, PLA_CNTL_C2 provided to arrays 72 and 74, respectively. A "Start CLKs C1,C2" signal is also output from logic 80, e.g., to a PLL (not shown) for controlling the employed internal clocks C1, C2. Two logic array control signals are provided to ensure correct latch to latch clock sequencing. PLA_CNTL_C1 is sourced with a PH1 latch and controls PLAs feeding PH2 latches. Similarly, PLA_CNTL_C2 is sourced from a PH2 latch and controls PLAs feeding PH1 latches.

Returning now to FIG. 4, the static PLA control sequence depicted begins with suspension of internal clocks C1, C2 upon receipt of an external halt (i.e., detection of an idle state condition), 50 "Suspend Internal Clocks." The combinatorial logic macros, such as static and dynamic PLAs, etc., are then powered down, 52 "Power Down PLA Macros," and the processor remains in low power mode until receipt of a restart signal, 54 "Wait For Restart Signal." Upon receipt of an external restart signal (e.g., an operator pressing a key) the logic arrays (such as arrays 72 and 76 in FIG. 6) are activated (e.g., signals PLA_CNTL_C1 and PLA_CNTL_C2 are switched to an inactive or low state), 56 "Activate PLA's Feeding 'C1' Logic" and 58 "Activate PLA's Feeding 'C2' Logic." Subsequent to steps 56 and 58 is the need to allow sufficient time for the outputs of the logic arrays (e.g., 72 and 74 in FIG. 6) and any subsequent circuitry connected thereto to stabilize based upon the inputs held in the associated input latches, 59 "Wait For PLA Outputs To Stabilize." Thereafter, clocks C1 and C2 are resumed, 60 "Resume Clock 'C1'," and 62 "Resume Clock 'C2'."

Figure 4:
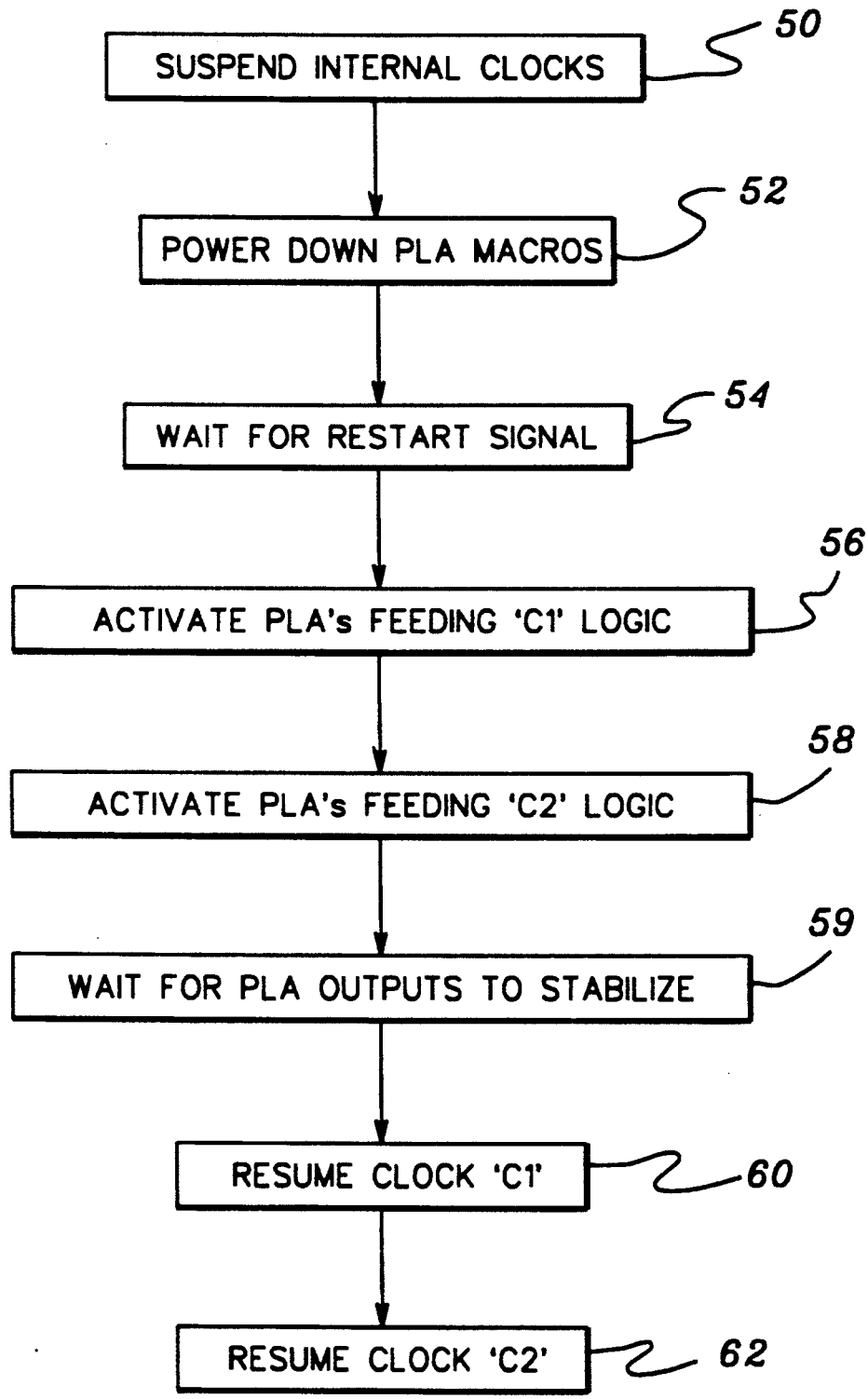
FIG. 4 is a flowchart of one embodiment of a control sequence protocol pursuant to the present invention for implementation with a logic macro such as shown in FIG. 6.

Note that the static PLA control sequence of FIG. 4 ensures that the logic array is powered down (e.g., for a static PLA at least partially isolated from supply voltage VDD) after halting of the macro's internal clock(s) and that the logic arrays are repowered before the internal clocks are resumed. Therefore, valid input to and output from the logic arrays is ensured. Also, in the timing diagram of FIG. 5 note that control signal PLA_CNTL_C1 and control signal PLA_CNTL_C2 are activated out of phase since the inputs to the corresponding arrays are clocked by different signals, i.e., signal 'C1' and signal 'C2', respectively. (Again, the timing diagrams shown could be extended for any number of clock phases.) In FIG. 5 it is also assumed that the outputs from logic arrays 72 and 74 will stabilize within a phase of the associated clock signals. The amount of delay needed to ensure stabilization before reactivating the internal clocks is assumed to be predetermined, i.e., known by the circuit designer.

Figure 7:
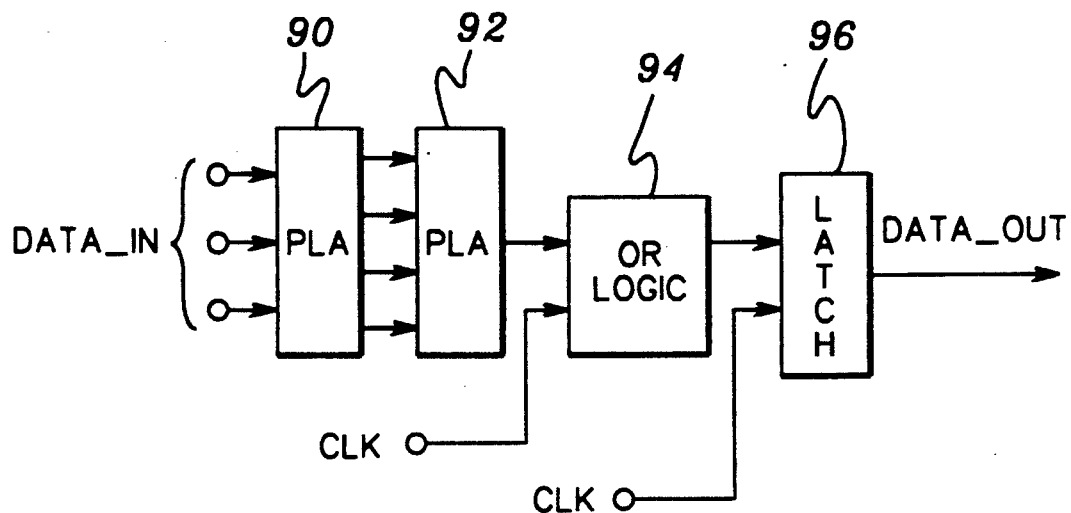
FIG. 7 is a block diagram representation of one embodiment of multiple, sequentially connected PLAs and combinatorial logic useful in describing clock restart timing pursuant to the present invention.

The stabilization time required before clock restart is defined as the longest path through a particular logic array to an output storage element. The path may contain multiple logic arrays, as well as one or more static combinatorial logic circuits. For example, FIG. 7 depicts a PLA 90 (receiving input data DATA_IN) in series with a second PLA 92, the output of which is passed through a combinatorial logic 94 and ultimately saved at a latch 96 from which DATA_OUT is clocked. Combinatorial logic 94 and latch 96 receive internal clock signals "CLK", such as signals C1 and C2 discussed above.

Figure 8:
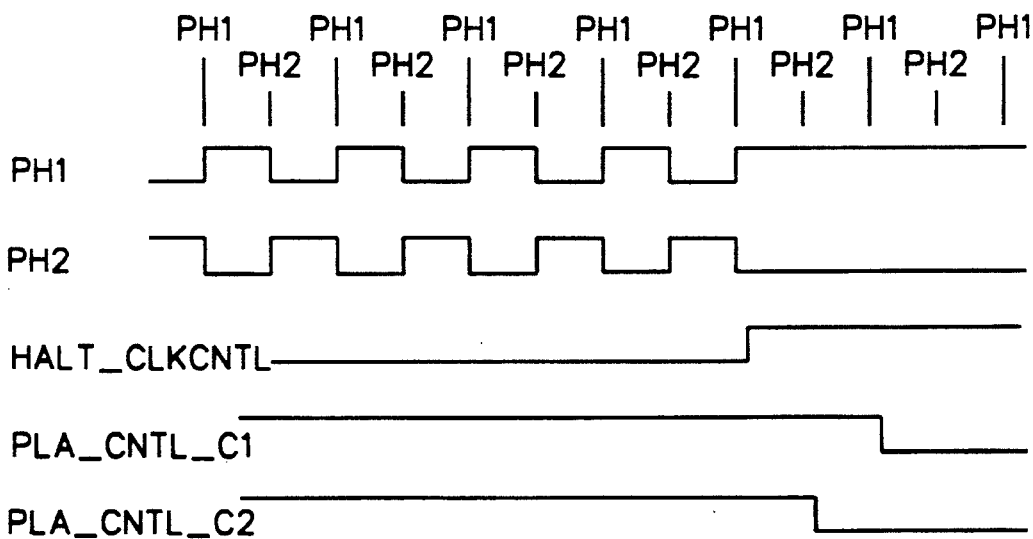
FIG. 8 is a timing diagram useful in explaining power-down processing pursuant to the present invention for a logic macro such as shown in FIG. 6.
Figure 9:
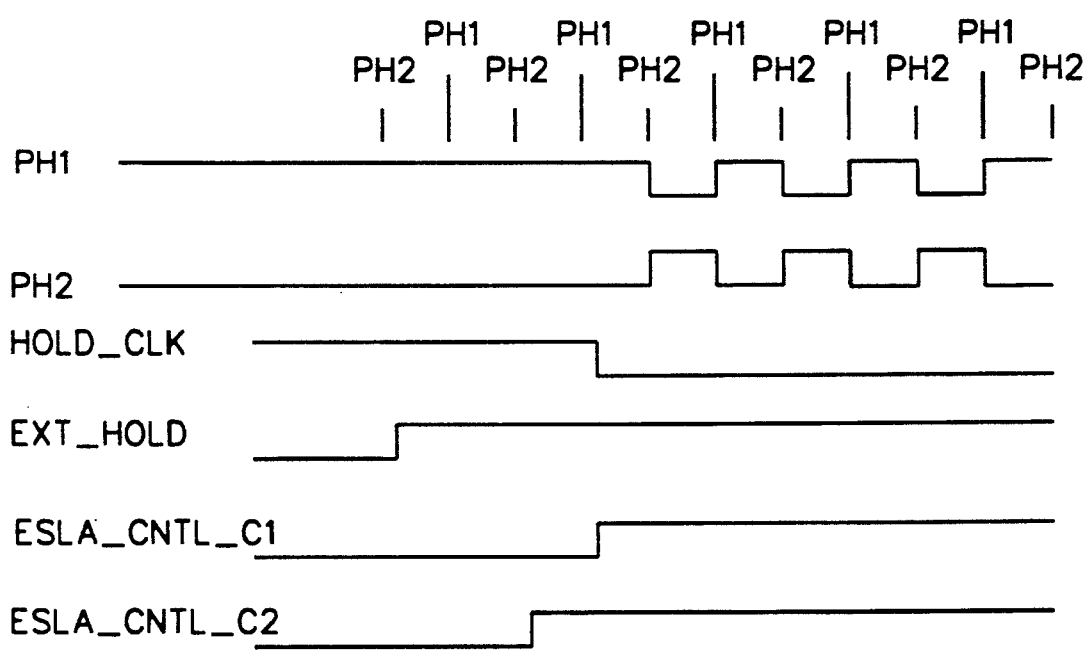
FIG. 9 is a timing diagram useful in explaining upon termination of a HOLD signal, power-up processing pursuant to the present invention for a logic macro such as shown in FIG. 6.

Referring next to the timing diagrams of FIGS. 8 and 9. The processor enters a low power halt state when an external halt condition is applied. For example, in the timing diagram of FIG. 8 the signal HALT_CLKCNTL changes simultaneously with the application of an external halt condition. Internal clocks C1 and C2 are first fixed for the duration of the halt condition, and the control signals PLA_CNTL_C1 and PLA_CNTL_C2 are both subsequently dropped from a high condition to a low condition, resulting in zero outputs from the respective logic arrays.

A low power halt state could be temporarily exited by the processor pursuant to one of several conditions. For example, a "reset", an "interrupt", or a "HOLD" could be asserted. A "reset" condition is considered global and no timing requirement for logic array repowering is required. However, the "interrupt" and "HOLD" conditions both require logic arrays to be powered before clocks are restarted as discussed above in connection with termination of the halt condition. With the "interrupt" condition, no additional latency is typically needed by taking advantage of existing signals in the clock control logic. For example, after an interrupt is asserted, synchronization and control logic delay typically enable clock restart to follow by three or more clock periods, thereby normally allowing the logic arrays sufficient time to repower and attain a stabilized output.

When a "HOLD" is asserted, and possibly, bus snooping for internal cache occurs, internal clocks also need to be restarted. As shown in FIG. 9, activation of a HOLD condition occurs with a low to a high transition subsequent which clocks C1 and C2 are initiated and control signals PLA_CNTL_C1 and PLA_CNTL C2 are set active. A time delay exists between application of an external hold EXT_HOLD and initiation of a HOLD clock signal HOLD_CLK. This added latency may be need in order to provide sufficient time for the logic arrays to repower. Again, the needed latency depends upon the particular logic macro implemented and it is assumed to be known or at least readily determinable by one skilled in the art.

As stated, the concepts presented herein can be extended to dynamic logic arrays and other types of CMOS circuits wherein standby power can continue to be drawn notwithstanding a halting of the internal clocks. For example, in a dynamic programmable logic array (PLA) a deactivation sequence is possible wherein clocks to latches feeding the dynamic PLA are halted prior to the clocks to the PLA itself. In this way, input data to the PLA is preserved and the output of the PLA can be readily reconstructed by reactivating the PLA clocks first and allowing a sufficient period of time for the output to stabilize before reactivating the clock(s) to any associated input latch. Similarly, a string of dynamic PLAs or a combination of dynamic PLAs and static PLAs or dynamic PLAs and other types of combinatorial logic circuits may be constructed all of which would be reactivated prior to reactivation of any clocking signal for static latches containing the inputs to such circuits. Obviously, the period of time required to stabilize the output will depend upon the particular circuit configuration. Again this information is assumed to be known or at least easily determinable by one skilled in the art.

Based upon the above discussion, it will be observed that a novel control circuit and protocol are provided for a logic macro (such as a static or dynamic PLA) implemented in complementary technology wherein standby power drain is minimized during an idle state condition. This is accomplished without the loss of integrated circuit states and without requiring the outputs of the logic macro to be stored prior to initiation of the idle state condition. The techniques presented beneficially allow for a more practical use of high performance and high density static PLAs in a portable computer. The circuit and protocol allow for the consumption of several orders of magnitude less power when in standby mode in comparison with conventional circuit shutdown approaches. Extended battery life is an obvious result of reducing standby power consumption. In a competitive market, this advantage is significant.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A method for reducing power drain within a logic macro during an idle state, said logic macro including a logic array having a plurality of data inputs each of which is coupled to a static latch which holds current data input to the array, said logic array being coupled to a supply voltage VDD and having an output based on the input data thereto, said logic array being clocked by at least one internal clock of the logic macro, said power drain reducing method comprising the steps of:
   (a) deactivating said logic macro in response to initiation of an idle state, said deactivating including halting said at least one internal clock and, subsequent thereto, at least partially decoupling said logic array from said supply voltage VDD such that standby power drain through said logic array is reduced;
   (b) reactivating said logic array in response to termination of said idle state, said reactivating including recoupling said logic array to said supply voltage VDD to the extent of said array decoupling from said supply voltage VDD in said step (a), and allowing sufficient time for the output of said logic array to stabilize based on the current data input to the array held in said static latch; and
   (c) restarting the at least one internal clock to said logic array subsequent stabilization of the output of said logic array.

2. The method of claim 1, further comprising the step of providing prior to said step (b) the necessary period of time for the output of said logic array to stabilize.

3. The method of claim 1, wherein said logic macro includes multiple logic arrays each having multiple data inputs, each array being coupled to a separate static latch holding the current data input for said array, and each logic array being coupled to supply voltage VDD and having an output based on the current input data thereto, each of said static latches being driven by an internal clock, and wherein said deactivating step (a) includes halting said internal clock to each of said static latches and, subsequent thereto, at least partially decoupling each logic array from said supply voltage VDD such that the standby power drain through the logic array in reduced, and wherein said reactivating step (b) includes recoupling each of said logic arrays to said supply voltage VDD and allowing sufficient time for the output of each of said logic arrays to stabilize based on current data input to the array held in the associated static latch.

4. The method of claim 3, wherein said multiple logic arrays are deactivated in said step (a) in a defined order and wherein said reactivating step (b) includes reactivating said logic arrays in the same order as said defined order of deactivation.

5. The method of claim 3, wherein said logic macro is controlled pursuant to multiple internal clocks and wherein said multiple internal clocks are halted in said step (a) in a defined order, and wherein said restarting step (c) includes restarting said internal clocks in the same order as said defined order of halting.

6. The method of claim 1, further comprising the step of detecting initiation of an idle state, said deactivating step (a) being responsive to said idle state detecting step.

7. The method of claim 1, further comprising the step of detecting termination of an idle state, said reactivating step (b) being responsive to said idle state termination detecting step.

8. The method of claim 1, wherein said logic macro deactivating step (a) includes providing an active IDLE control signal to said logic array, said active IDLE control signal resulting in at least partial decoupling of said logic array from said supply voltage VDD.

9. The method of claim 1, wherein said logic array reactivating step (b) includes providing an inactive IDLE control signal to said logic array, said inactive IDLE control signal resulting in recoupling of said logic array to said supply voltage VDD to the extent of said array decoupling from said supply voltage VDD in said step (a).

10. A power-down process for halting a logic macro including a logic array having a data input and a data output, said data input being coupled to a static latch which holds current data input to the logic array, the logic array being coupled to a supply voltage VDD and the macro having an internal clock which clocks the logic array, said power-down process being responsive to an idle state triggering signal, said power-down process comprising the steps of:
   (a) detecting said triggering signal to initiate an idle state condition;
   (b) in response to detecting said triggering signal in said step (a), halting said macro's internal clock so that the current input data held in said macro's static latch is preserved; and
   (c) subsequent said step (b), at least partially decoupling said logic array from said supply voltage VDD so that standby power drain through said array is minimized, whereby valid input data is maintained in said static latch during said idle state condition so that the output of said array may be reestablished subsequent said idle state condition.

11. The power-down process of claim 10, wherein said logic macro includes multiple logic arrays and multiple internal clocks, and wherein said halting step (b) includes halting said multiple internal clocks in a defined order, and said decoupling step (c) includes at least partially decoupling said logic arrays from said supply voltage VDD in a defined order.

12. A power-up process for activating a logic macro from an idle state, said macro having a logic array with a data input and a data output, said data input being coupled to a static latch which holds current data input to said array, said logic array being at least partially decoupled from a supply voltage VDD during said idle state, and said logic macro having an internal clock which is halted during said idle state said internal clock for clocking the logic array, said power-up process comprising the steps of:
   (a) detecting a triggering signal to terminate said idle state;
   (b) reactivating said logic array upon detecting said triggering signal in said step (a), said logic array reactivating including recoupling said decoupled logic array to said supply voltage VDD;
   (c) waiting a sufficient period of time for the array's data output to stabilize; and
   (d) subsequent said step (c), restarting the halted internal clock for said logic array.

13. The power-up process of claim 12, wherein said logic macro includes multiple logic arrays, said logic arrays having been deactivated in a defined order for said idle state, and wherein said reactivation step (b) includes reactivating said logic arrays in the same order as said defined order of deactivation.

14. The power-up process of claim 13, wherein said logic macro is clocked by multiple internal clocks, said multiple internal clocks having been halted in a defined order for said idle state, and wherein said restarting step (d) includes restarting said internal clocks in the same order as said defined order of halting.

15. A power conserving method for an integrated circuit including a static logic portion and a dynamic logic portion each having an input and an output, said dynamic logic portion being coupled to receive its input from the output of said static logic portion, said static logic portion and said dynamic logic portion each being clocked by an internal clock signal, said power conserving method for minimizing power consumption in said integrated circuit during an idle state condition, said method comprising the steps of:
   (a) halting the internal clock to said dynamic logic portion upon detection of an idle state condition;
   (b) subsequent said step (a), halting the internal clock to said static logic portion of said integrated circuit;
   (c) maintaining said dynamic portion's internal clock and said static portion's internal clock in said halted condition for the duration of said idle state;
   (d) returning said dynamic logic portion to an active state subsequent said idle state condition by restarting said dynamic portion's internal clock;
   (e) waiting sufficient time for the output of said dynamic logic portion to stabilize; and
   (f) restarting said static portion's internal clock.

16. The power conserving method of claim 15, wherein said idle state condition is initiated by an 'active' triggering signal and said method further comprises detecting said triggering signal corresponding to initiation of said idle state condition prior to said step (a).

17. The power conserving method of claim 16, wherein said idle state condition is terminated by an 'inactive' triggering signal and said method further comprises detecting said triggering signal corresponding to termination of said idle state condition prior to said step (d).

18. In an integrated circuit having a first logic portion and a second logic portion, a method for minimizing power consumption during an idle state condition without requiring storing of the second logic portion state, said second logic portion having an input fed by an output of said first logic portion, said first logic portion comprising a static logic portion, said second logic portion being coupled to a supply voltage VDD, said method for minimizing power consumption during idle state condition comprising the steps of:
   (a) placing said integrated circuit in a lower power consuming state upon initiation of said idle state condition by:
       (i) suspending all clocks feeding said first, static logic portion so as to retain the output state of said first logic portion,
       (ii) at least partially decoupling said second logic portion from said circuit supply voltage VDD such that standby power drain through said second logic portion is minimized, and
   (b) returning said integrated circuit to an active state subsequent said idle state condition by:
       (i) recoupling said decoupled said logic portion to said circuit supply voltage VDD, so as to restore the state of said second logic portion based on the captured output state of said first, static logic portion, and
       (ii) activating any internal clocks feeding said static logic portion halted in said step (a)(i).

19. A programmable logic array which consumes substantially zero dc power when in standby mode, said array comprising:
   a plurality of input ports for receiving a plurality of input signals;
   a plurality of output ports for providing a plurality of output signals;
   a plurality of product term nodes; and
   a plurality of control circuits, each comprising a first transistor device connected to the power supply and a second transistor device, complementary to said first device, connected to ground, said first and second transistor devices being connected in series through a common point that is also connected to one of said product term nodes, the gates of said control circuits being connected to a control port, the provision of a "one" to said control port activating said second transistor device so as to drive said product terms to "zero", and the provision of a "zero" to said control port activating said first transistor device to provide a pull-up function to said common point connection to said one of said product term nodes.

20. The logic array of claim 19, wherein said array comprises a static logic array.

21. The logic array of claim 19, wherein each said control port comprises an IDLE state control port.

22. The logic array of claim 19, wherein each first transistor device comprises a PFET and each second transistor device comprises an NFET.

23. The logic array of claim 19, further in combination with a static latch for holding present data input to said logic array, said static latch being coupled to said plurality of input ports for providing said plurality of input signals, whereby subsequent standby mode, said current data inputs are provided to said input ports for reestablishing the state of said programmable logic array.

* * * * *

UNITED STATES PATENT AND TRADEMARK OFFICE
CERTIFICATE OF CORRECTION

PATENT NO. : 5,300,831
DATED : Apr. 5, 1994
INVENTOR(S) : Pham et al.

It is certified that error appears in the above-indentified patent and that said Letters Patent is hereby corrected as shown below:

Column 3, line 3, delete "a" and substitute therefor --an--.

Column 12, line 24, delete "said" (second occurrence) and substitute therefor --second--.

Signed and Sealed this

Ninth Day of August, 1994

Attest:

BRUCE LEHMAN

Attesting Officer

Commissioner of Patents and Trademarks